US009224710B2

(12) United States Patent
Park

(10) Patent No.: US 9,224,710 B2
(45) Date of Patent: Dec. 29, 2015

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Jin-Woo Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/463,854

(22) Filed: Aug. 20, 2014

(65) Prior Publication Data

US 2015/0123289 A1    May 7, 2015

(30) Foreign Application Priority Data

Nov. 7, 2013 (KR) .................. 10-2013-0134937

(51) Int. Cl.
| | |
|---|---|
| *H01L 23/02* | (2006.01) |
| *H01L 23/00* | (2006.01) |
| *H01L 23/538* | (2006.01) |
| *H01L 25/065* | (2006.01) |
| *H01L 25/10* | (2006.01) |
| *H01L 23/13* | (2006.01) |
| *H01L 23/14* | (2006.01) |
| *H01L 23/498* | (2006.01) |
| *H01L 23/31* | (2006.01) |

(52) U.S. Cl.
CPC ............ *H01L 24/49* (2013.01); *H01L 23/5385* (2013.01); *H01L 23/5389* (2013.01); *H01L 24/14* (2013.01); *H01L 24/32* (2013.01); *H01L 25/065* (2013.01); *H01L 25/10* (2013.01); *H01L 23/13* (2013.01); *H01L 23/145* (2013.01); *H01L 23/3128* (2013.01); *H01L 23/49811* (2013.01); *H01L 2224/32225* (2013.01)

(58) Field of Classification Search
CPC ............ H01L 21/8239; H01L 23/3114; H01L 23/3121; H01L 23/3142; H01L 23/3157; H01L 23/3171; H01L 23/32; H01L 23/4012; H01L 23/48; H01L 23/49513; H01L 23/4952; H01L 23/4953; H01L 23/49811; H01L 23/49822; H01L 23/49833; H01L 24/10; H01L 24/82; H01L 24/95; H01L 24/97
USPC ......... 257/678, 296, 686, 687, 690, 700, 729, 257/734, 735, 736, 737, 738, 753, 754, 772, 257/777, 778, 781, 782, 783, 784, 787, 257/E21.006, E21.007, E21.126, E21.127, 257/E21.267, E21.499, E21.502, E21.503, 257/E21.504, E21.508, E21.509, E21.511, 257/E21.613, E21.645
See application file for complete search history.

(56) References Cited

U.S. PATENT DOCUMENTS

| | | | |
|---|---|---|---|
| 7,279,795 | B2 | 10/2007 | Periaman et al. |
| 7,429,786 | B2 | 9/2008 | Karnezos et al. |

(Continued)

FOREIGN PATENT DOCUMENTS

| | | | |
|---|---|---|---|
| KR | 10-0961308 B1 | 6/2010 | |
| KR | 10-0961309 B1 | 6/2010 | |

*Primary Examiner* — David Nhu
(74) *Attorney, Agent, or Firm* — Sughrue Mion, PLLC

(57) ABSTRACT

Provided is a semiconductor package, the semiconductor package includes a first substrate, a first semiconductor chip which is mounted on the first substrate, a second substrate which is disposed on the first semiconductor chip, at least one second semiconductor chip which is disposed on the second substrate; and a plurality of wires which are in contact with the first substrate and the second substrate to connect the first substrate and the second substrate to each other.

20 Claims, 20 Drawing Sheets

(56) References Cited

U.S. PATENT DOCUMENTS

| | | |
|---|---|---|
| 7,750,455 B2 | 7/2010 | Pagaila et al. |
| 8,222,738 B2 * | 7/2012 | Ota et al. .................. 257/737 |
| 8,258,015 B2 | 9/2012 | Chow et al. |
| 8,558,393 B2 * | 10/2013 | Kuroda .................. 257/777 |
| 2006/0073635 A1 * | 4/2006 | Su et al. .................. 438/109 |
| 2006/0244117 A1 | 11/2006 | Karnezos et al. |
| 2007/0152313 A1 | 7/2007 | Pariaman et al. |
| 2007/0252284 A1 | 11/2007 | Su et al. |
| 2007/0278696 A1 | 12/2007 | Lu et al. |
| 2009/0212442 A1 | 8/2009 | Chow et al. |
| 2010/0032821 A1 | 2/2010 | Pagaila et al. |
| 2010/0155919 A1 * | 6/2010 | Song et al. .................. 257/686 |
| 2010/0237490 A1 | 9/2010 | Chu et al. |
| 2011/0300672 A1 * | 12/2011 | Ota et al. .................. 438/124 |
| 2013/0032952 A1 | 2/2013 | Cho et al. |
| 2013/0069240 A1 | 3/2013 | Yang et al. |
| 2013/0075887 A1 | 3/2013 | Suzuki |
| 2013/0075915 A1 | 3/2013 | Kim et al. |
| 2013/0075919 A1 | 3/2013 | Oh et al. |
| 2013/0075926 A1 | 3/2013 | Bae et al. |
| 2013/0084678 A1 | 4/2013 | Jeong |
| 2013/0087911 A1 | 4/2013 | Gregorich et al. |
| 2013/0099333 A1 | 4/2013 | Zuniga-Ortiz et al. |

* cited by examiner

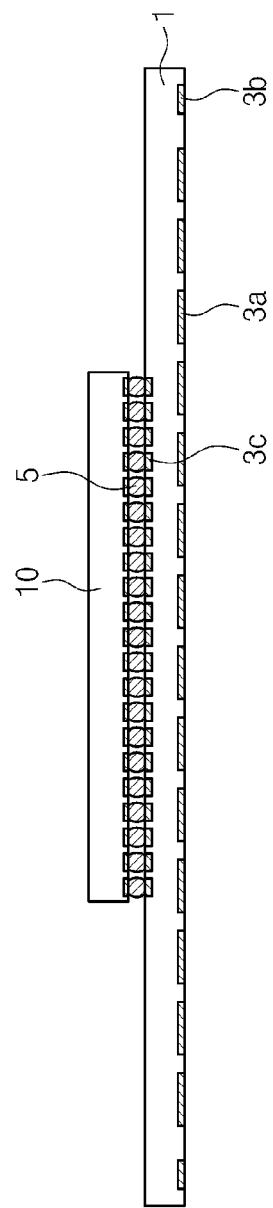
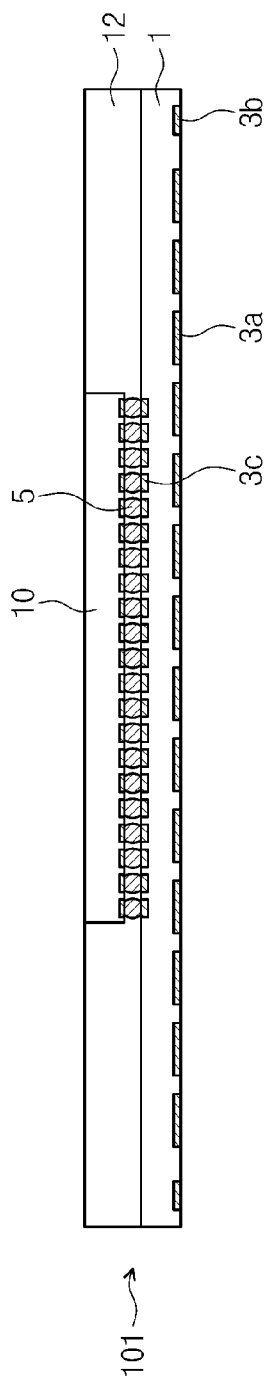

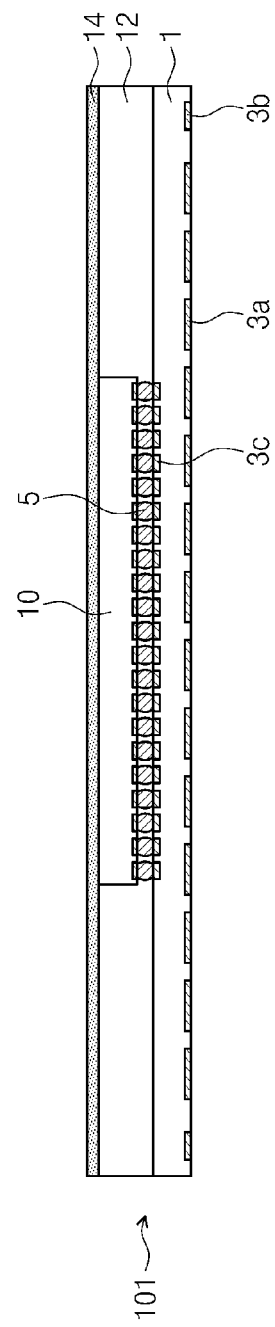
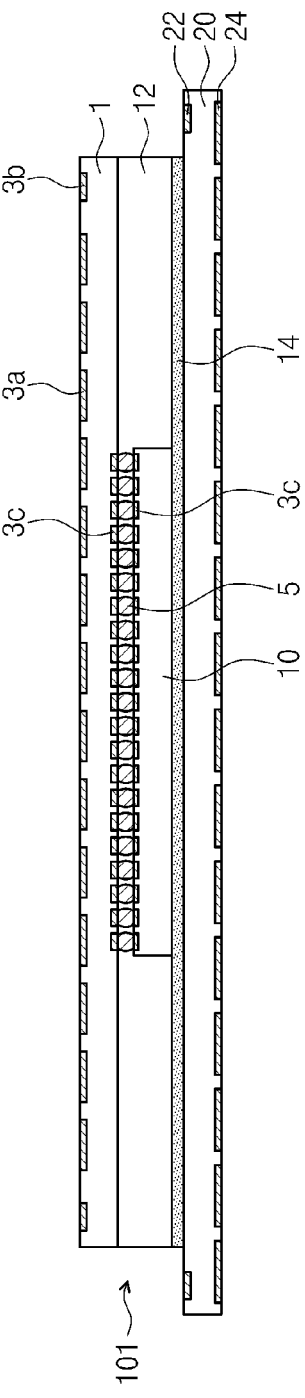

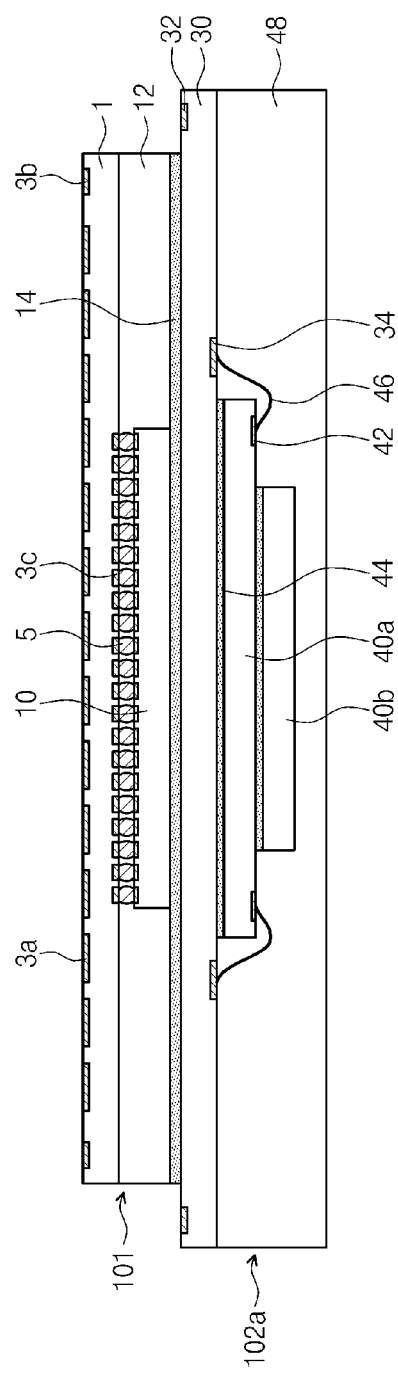
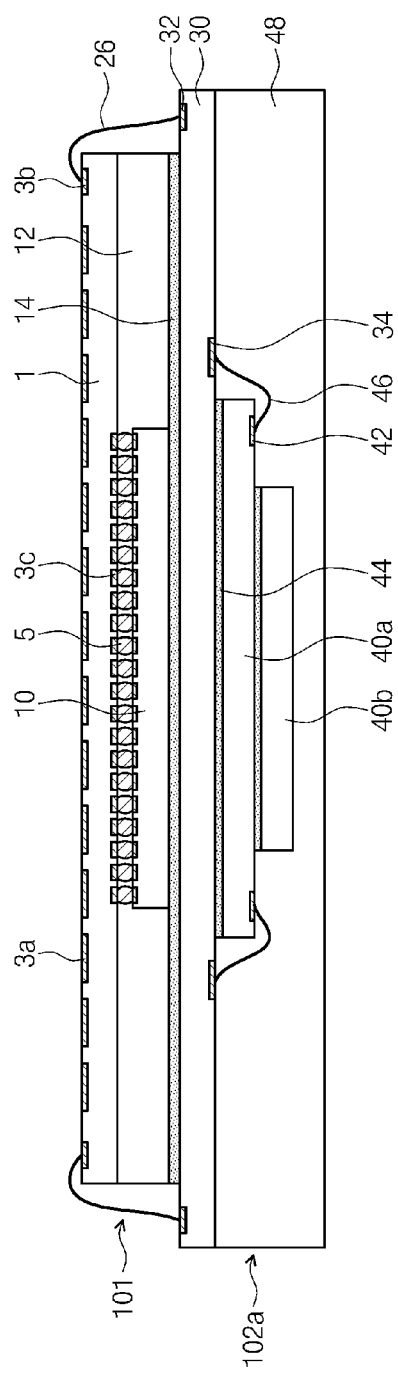

SEMICONDUCTOR PACKAGE AND METHOD OF FABRICATING THE SAME

CROSS-REFERENCE TO RELATED APPLICATIONS

This U.S. non-provisional patent application claims priority from Korean Patent Application No. 10-2013-0134937, filed on Nov. 7, 2013, in the Korean Intellectual Property Office, the entire disclosure of which are incorporated herein by reference.

BACKGROUND

Exemplary embodiments relate to a semiconductor package and a method of fabricating the same.

In the electronic industry, there is an increased demand for high-performance, high-speed, and compact electronic systems. Various semiconductor package techniques have been developed to fulfill this demand. For example, a semiconductor package device may be configured to have a package-on-package (PoP) structure, in which a plurality of semiconductor chips is mounted on a package substrate. In mobile devices, it is necessary to increase the number of channels or I/O pads in order to realize high-performance (i.e., high bandwidth). Accordingly, there is an increased focus to increase the number of channels or I/O pads between lower and upper packages in the PoP structure.

SUMMARY

Exemplary embodiments may provide a semiconductor package capable of increasing the number of channels or I/O pads between lower and upper packages.

Other exemplary embodiments may provide a method of fabricating the semiconductor package.

One or more exemplary embodiments may provide a semiconductor package which may include a first substrate, a first semiconductor chip which is mounted on the first substrate, a second substrate which is disposed on the first semiconductor chip, at least one second semiconductor chip which is disposed on the second substrate, and a plurality of wires which are in contact with the first substrate and the second substrate to connect the first substrate and the second substrate to each other.

In the one or more exemplary embodiments, the second substrate may have a larger width than the first substrate.

In the one or more exemplary embodiments, the second substrate may include at least a portion located outside of the first substrate, when viewed in a plan view.

In the one or more exemplary embodiments, the semiconductor package may further include a mold layer which covers at least a side surface of the first semiconductor chip and the first substrate.

In the one or more exemplary embodiments, the semiconductor package may further include an adhesive layer which is interposed between the first semiconductor chip and the second substrate to attach the first semiconductor chip to the second substrate.

In the one or more exemplary embodiments, the semiconductor package may further include a third substrate which is disposed on the second substrate and electrically connected to the second substrate. The at least one second semiconductor chip may be mounted on the third substrate.

In the one or more exemplary embodiments, the semiconductor package may further include a plurality of solder balls which are interposed between the second substrate and the third substrate to electrically connect the second substrate and the third substrate to each other.

In the one or more exemplary embodiments, the semiconductor package may further include a protection member which covers the wires. The protection member may include at least one of a mold layer, an adhesive resin layer, or a holder.

In the one or more exemplary embodiments, the first semiconductor chip may be a logic chip and the at least one second semiconductor chip may be a memory chip.

In the one or more exemplary embodiments, an edge portion of the first substrate may have a staircase structure. The first substrate may include a first substrate conductive pattern and a second substrate conductive pattern which are positioned at different levels in a vertical direction from each other. The second substrate may include a third substrate conductive pattern and a fourth substrate conductive pattern which are spaced apart in a horizontally direction from each other. The wires may include a first wire which connects the first substrate conductive pattern to the third substrate conductive pattern and a second wire which connects the second substrate conductive pattern to the fourth substrate conductive pattern.

In the one or more exemplary embodiments, the semiconductor package may further include a third substrate which is disposed on the second substrate and electrically connected to the second substrate. The wires may be connected to the first substrate, the second substrate, and the third substrate. The at least one second semiconductor chip may be mounted on the third substrate.

In the one or more exemplary embodiments, the semiconductor package may further include a plurality of solder balls which are attached to a bottom surface of the first substrate.

One or more exemplary embodiments may provide a semiconductor package which may include a first package, a second package which is stacked on the first package, and a plurality of wires which electrically connect the first package to the second package.

In the one or more exemplary embodiments, the second package may include at least an end portion located outside of the first package, when viewed in a plan view.

In the one or more exemplary embodiments, the second package may have a larger width than the first package.

In the one or more exemplary embodiments, the semiconductor package may further include an interposer substrate which is interposed between the first package and the second package. The wires may electrically connect the interposer substrate to the first package.

In the one or more exemplary embodiments, the first package and the second package may include a first substrate and a second substrate, respectively, the first package and the second package may be attached to each other by an adhesive layer, and the wires electrically connect the first substrate to the second substrate.

In the one or more exemplary embodiments, the first package may include a first substrate, and an edge portion of the first substrate may have a staircase structure.

One or more exemplary embodiments may provide a semiconductor package which may include a first package which includes an edge portion having a staircase structure; a second package which is stacked on the first package; and a plurality of wires which electrically connect an end portion of the staircase structure of the first package to the second package.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

FIGS. 3 through 10 are sectional views illustrating a process of fabricating a semiconductor package, whose sectional view is shaped like that of FIG. 2.

FIGS. 12 through 14 are sectional views illustrating a process of fabricating a semiconductor package, whose sectional view is shaped like that of FIG. 11.

Figure 1:
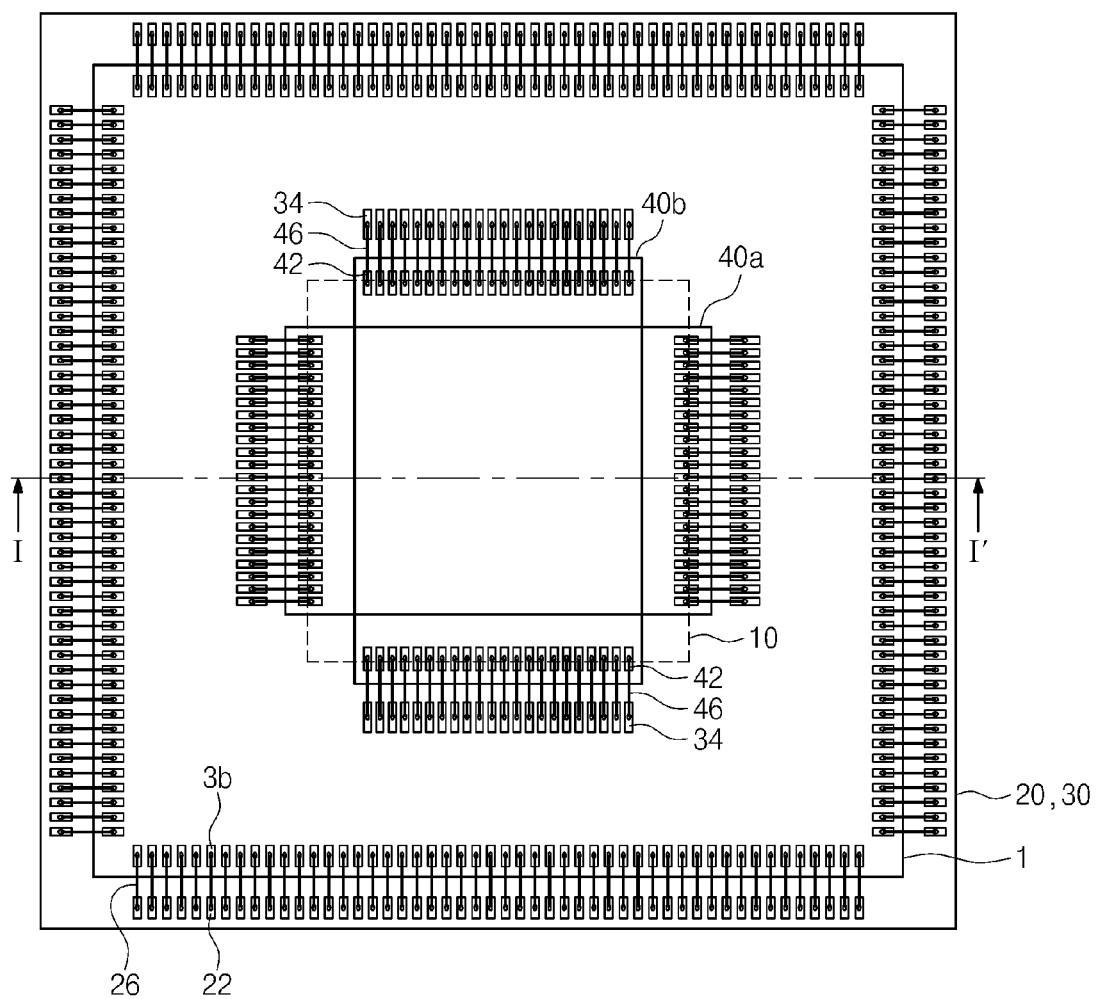
FIG. 1 is a layout diagram of a semiconductor package according to exemplary embodiments.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXEMPLARY EMBODIMENTS

Exemplary embodiments will now be described more fully with reference to the accompanying drawings, in which exemplary embodiments are shown. Exemplary embodiments may, however, be embodied in many different forms and should not be construed as being limited to the embodiments set forth herein. Rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting the exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
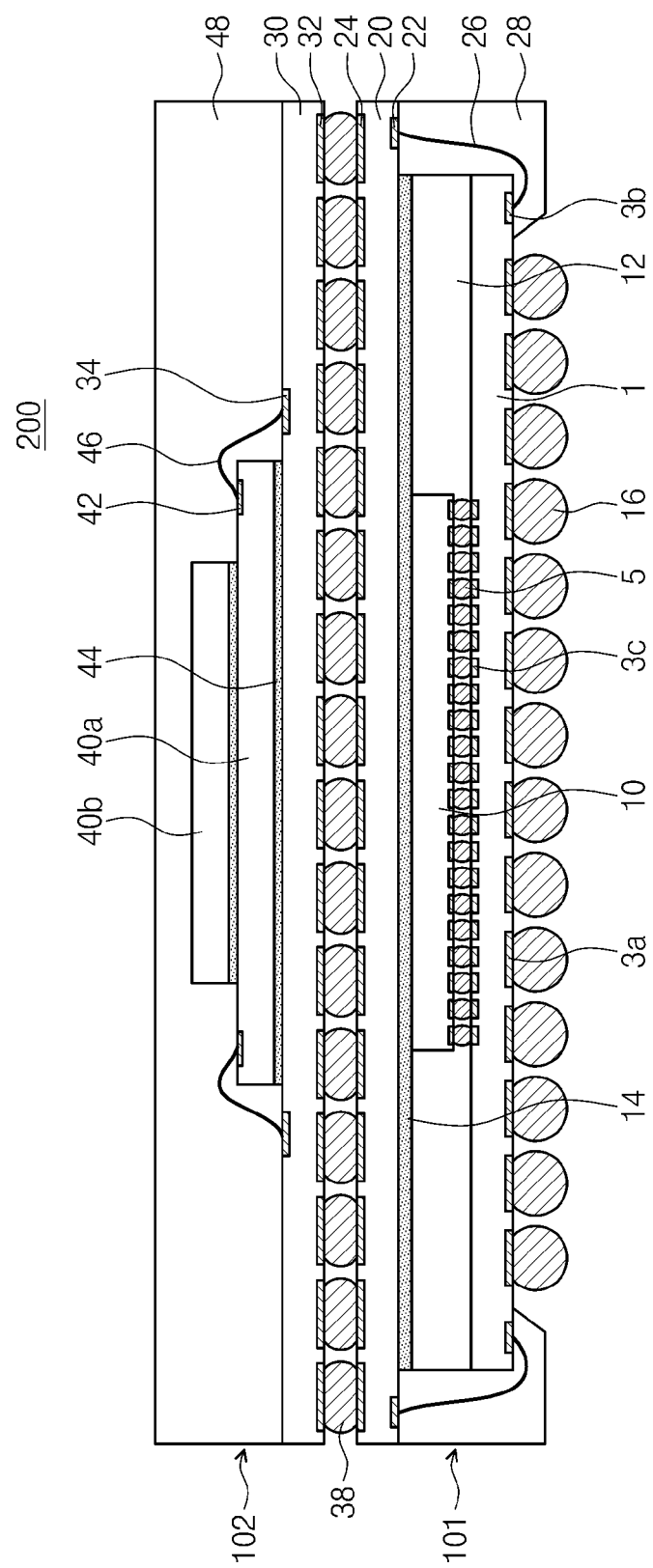
FIG. 2 is a sectional view taken along line I-I' of FIG. 1.

FIG. 1 is a layout diagram of a semiconductor package according to exemplary embodiments, and FIG. 2 is a sectional view taken along line I-I' of FIG. 1.

Referring to FIGS. 1 and 2, in a semiconductor package 200 according to the present embodiments, a first semiconductor chip 10 may be mounted, in a flip-chip bonding manner, on a first substrate 1 using first solder balls 5. The first substrate 1 may be a printed circuit board. The first substrate 1 may include eleventh, twelfth, and thirteenth substrate conductive patterns 3a, 3b, and 3c provided on top and bottom surfaces, and through vias or internal wires (not shown) may be provided in the first substrate 1 and be electrically connected to the eleventh to thirteenth substrate conductive patterns 3a, 3b, and 3c. The eleventh to thirteenth substrate conductive patterns 3a, 3b, and 3c may include the eleventh substrate conductive patterns 3a and the twelfth substrate conductive patterns 3b, which are disposed on the bottom surface of the first substrate 1, and the thirteenth substrate conductive patterns 3c disposed on the top surface of the first substrate 1. The first solder balls 5 may be attached to the thirteenth substrate conductive patterns 3c. Second solder balls 16 may be attached to the eleventh substrate conductive patterns 3a to provide electrical pathways to the outside. A side surface of the first semiconductor chip 10 and the top surface of the first substrate 1 may be covered with a first mold layer 12. The first mold layer 12 may be provided to fill a gap region between the first semiconductor chip 10 and the first substrate 1. In exemplary embodiments, the first semiconductor chip 10 may be a logic chip. The first substrate 1, the first semiconductor chip 10, and the first mold layer 12 may constitute a first package 101.

A second substrate 20 may be disposed on the first semiconductor chip 10. The second substrate 20 may be an interposer substrate. The second substrate 20 may include twenty-first substrate conductive patterns 22 provided on a bottom surface thereof and twenty-second substrate conductive patterns 24 provided on a top surface thereof. The twenty-first and second substrate conductive patterns 22 and 24 may be electrically connected to each other by the through vias and internal wires (not shown) provided in the second substrate 20. The first package 101 may be attached to the bottom surface of the second substrate 20 by a first adhesive layer 14.

A third substrate 30 may be disposed on the second substrate 20. The third substrate 30 may be a printed circuit board. The third substrate 30 may include thirty-first substrate conductive patterns 32 provided on a bottom surface thereof and thirty-second substrate conductive patterns 34 provided on a top surface thereof. The third substrate 30 and the second substrate 20 may be electrically connected to each other. In other words, the twenty-second substrate conductive pattern 24 and the thirty-first substrate conductive pattern 32 may be electrically connected to each other by third solder balls 38 interposed therebetween. Second semiconductor chips 40a and 40b may be stacked on the third substrate 30. The second semiconductor chips 40a and 40b may be of the same type (e.g., memory chips). The second semiconductor chips 40a and 40b may be attached on the third substrate 30 by a second adhesive layer 44. The second semiconductor chips 40a and 40b may include chip conductive patterns 42 provided on both end portions thereof. The chip conductive patterns 42 may be connected to the thirty-second substrate conductive patterns 34 using first wires 46. The second semiconductor chips 40a and 40b and the third substrate 30 may be covered with a second mold layer 48. The third substrate 30, the second semiconductor chips 40a and 40b, and the second mold layer 48 may constitute a second package 102.

The third substrate 30 may have a width larger than that of the first substrate 1. In the present embodiments, when viewed in a plan view, the first substrate 1 may be positioned within the third substrate 30.

The first substrate 1 and the second substrate 20 may be electrically connected to each other. For example, the twelfth substrate conductive patterns 3b and the twenty-first substrate conductive patterns 22 may be connected to each other using second wires 26. The second wires 26 may be covered with a protection member 28. Therefore, the second wires 26 may be protected from an external attack. The protection member 28 may be a mold layer or an adhesive resin layer. The first wires 46 and the second wires 26 may be formed of a highly-ductile metal (e.g., gold, silver, or copper). The second solder balls 16 may have a thickness larger than a portion of the protection member 28 covering the twelfth substrate conductive patterns 3b.

A wire may have a thickness of about 12.5-350 μm, while the solder ball of the related art may have a diameter of about 0.3-0.7 mm or 300-700 μm. Accordingly, when comparing the minimum values thereof, the thickness of the wire may be about 4/100 of the diameter of the solder ball. In the case where the solder balls are used for interconnection, the solder balls should be spaced apart from each other with a spacing of several hundred micrometers or larger to prevent an electric short from occurring between the solder balls. Therefore, although it is necessary to increase the number of I/O terminals connecting the first semiconductor chip 10 and the second semiconductor chips 40a and 40b, there is a limitation in the number of solder balls that can be formed within a given area of the semiconductor package. By contrast, according to exemplary embodiments, the second wires 26, which are much thinner than the solder balls, may be used to connect the first substrate 101 to the second substrate 20. Thus, in the exemplary embodiments, it is possible to increase greatly the number of I/O terminals.

In the present embodiments, the semiconductor package 200 may include the first package 101, the second package 102 stacked thereon, and the interposer substrate 20 interposed between the first and second packages 101 and 102. Thus, the present embodiments may have a package-on-package structure.

FIGS. 3 through 10 are sectional views illustrating a process of fabricating a semiconductor package, whose sectional view is shaped like that of FIG. 2.

Referring to FIG. 3, a first semiconductor chip 10 may be mounted, in a flip-chip bonding manner, on a first substrate 1 by first solder balls 5. The first substrate 1 may include eleventh to thirteenth substrate conductive patterns 3a, 3b, and 3c.

Referring to FIG. 4, a molding process may be performed to form a first mold layer 12 covering a side surface of the first semiconductor chip 10 and a top surface of the first substrate 1. The first mold layer 12 may be formed to fill a gap region between the first semiconductor chip 10 and the first substrate 1. During the molding process, the first mold layer 12 may be formed to expose a top surface of the first semiconductor chip 10. Alternatively, the first mold layer 12 may be formed to cover the top surface of the first semiconductor chip 10. Then, the first mold layer 12 may be partially removed by a subsequent planarization etching process to expose the top surface of the first semiconductor chip 10. As a result, a first package 101 may be formed.

Referring to FIG. 5, a first adhesive layer 14 may be formed to cover the exposed top surfaces of the first semiconductor chip 10 and the first mold layer 12. In the exemplary embodiments, the first adhesive layer 14 may be a double-sided tape or a liquefied adhesive layer.

Referring to FIG. 6, the first package 101 may be inverted and the first package 101 may be attached to a second substrate 20 using the first adhesive layer 14. The second substrate 20 may include twenty-first and twenty-second substrate conductive patterns 22 and 24 provided on bottom and surfaces thereof, respectively.

Figure 7:
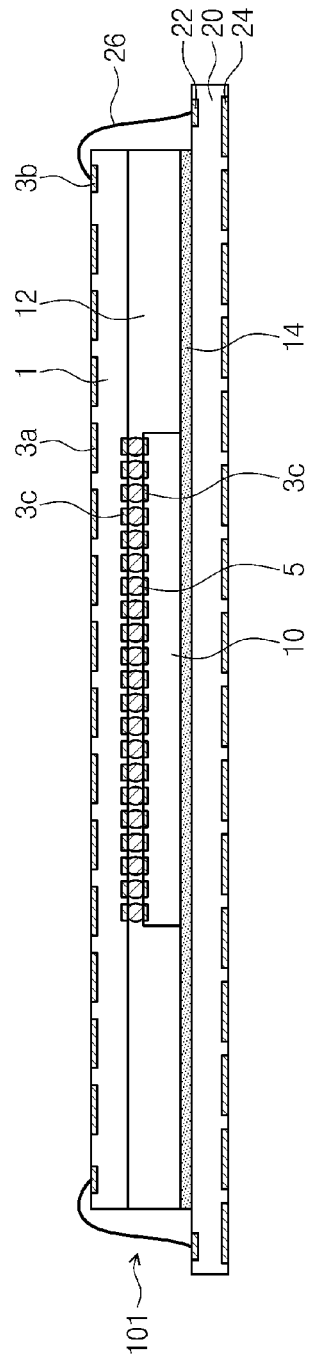

Referring to FIG. 7, a wire bonding process may be performed to form second wires 26 connecting the twelfth substrate conductive patterns 3b to the twenty-first substrate conductive patterns 22.

Figure 8:
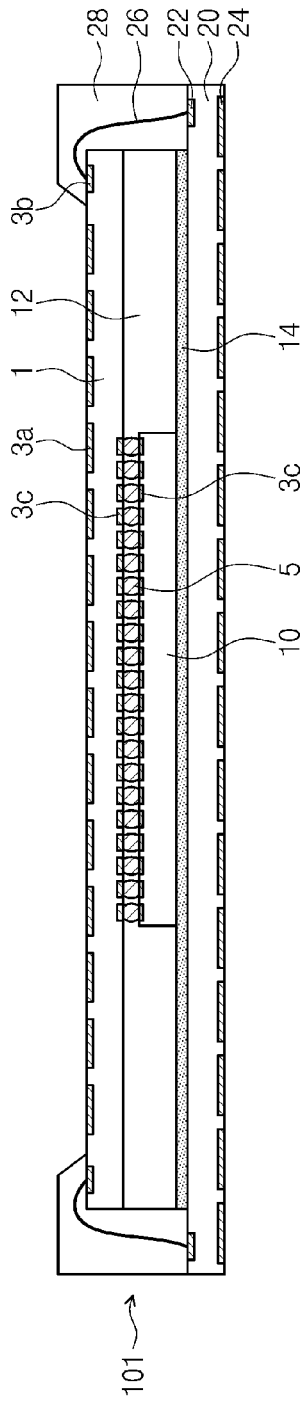

Referring to FIG. 8, a protection member 28 may be formed to cover the second wires 26. The protection member 28 may be formed using a molding or printing process. The protection member 28 may be formed of a mold layer or an adhesive resin layer. Further, the protection member 28 may be formed to cover top and side surfaces of edge portions of the first substrate 1, side surfaces of the first mold layer 12 and the first adhesive layer 14, and a top surface of the second substrate 20.

Figure 9:
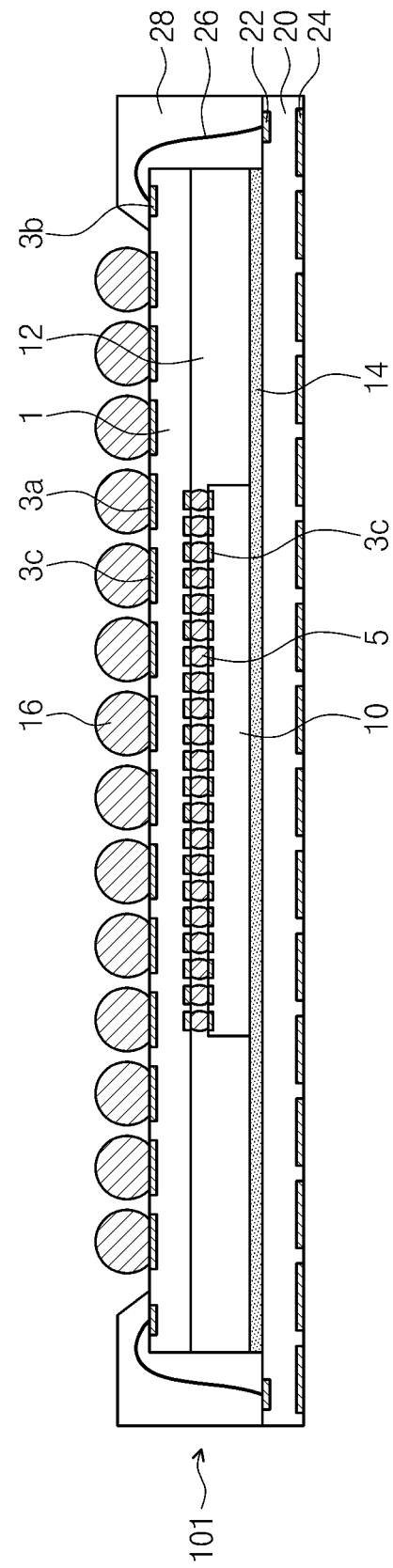

Referring to FIG. 9, second solder balls 16 may be attached to the eleventh substrate conductive patterns 3a.

Figure 10:
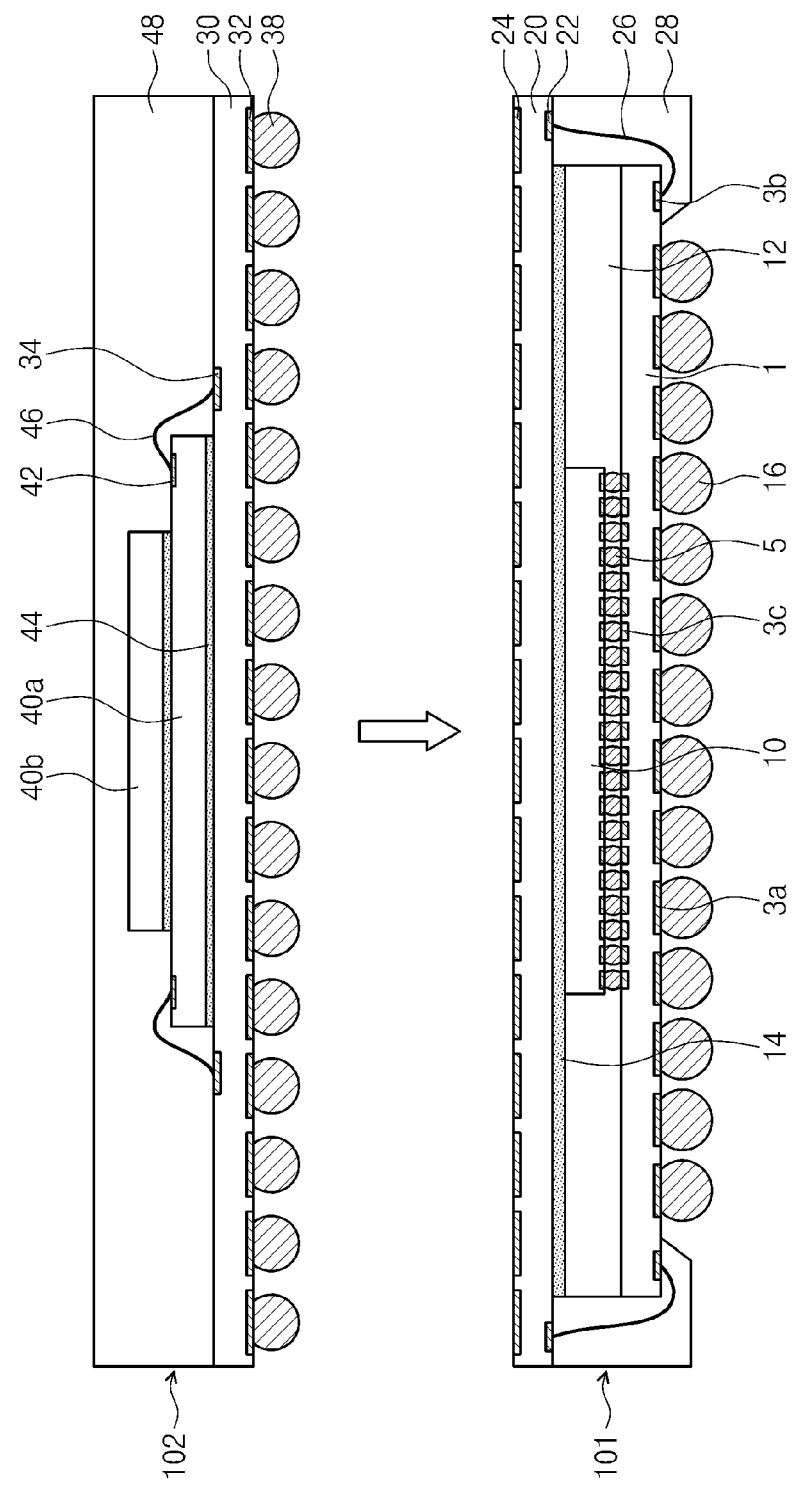

Referring to FIG. 10, the first package 101 attached to the second substrate 20 may be inverted. In addition, a second package 102 may be prepared. As described above, the second package 102 may include a third substrate 30, second semiconductor chips 40a and 40b stacked on the third substrate 30, a second mold layer 48 covering the second semiconductor chips 40a and 40b and the third substrate 30, and third solder balls 38 attached to a bottom surface of the third substrate 30. The second package 102 may be disposed on the second substrate 20. Then, the third solder balls 38 may be thermally attached to the twenty-second substrate conductive patterns 24, respectively, to connect electrically the second substrate 20 to the third substrate 30.

Figure 11:
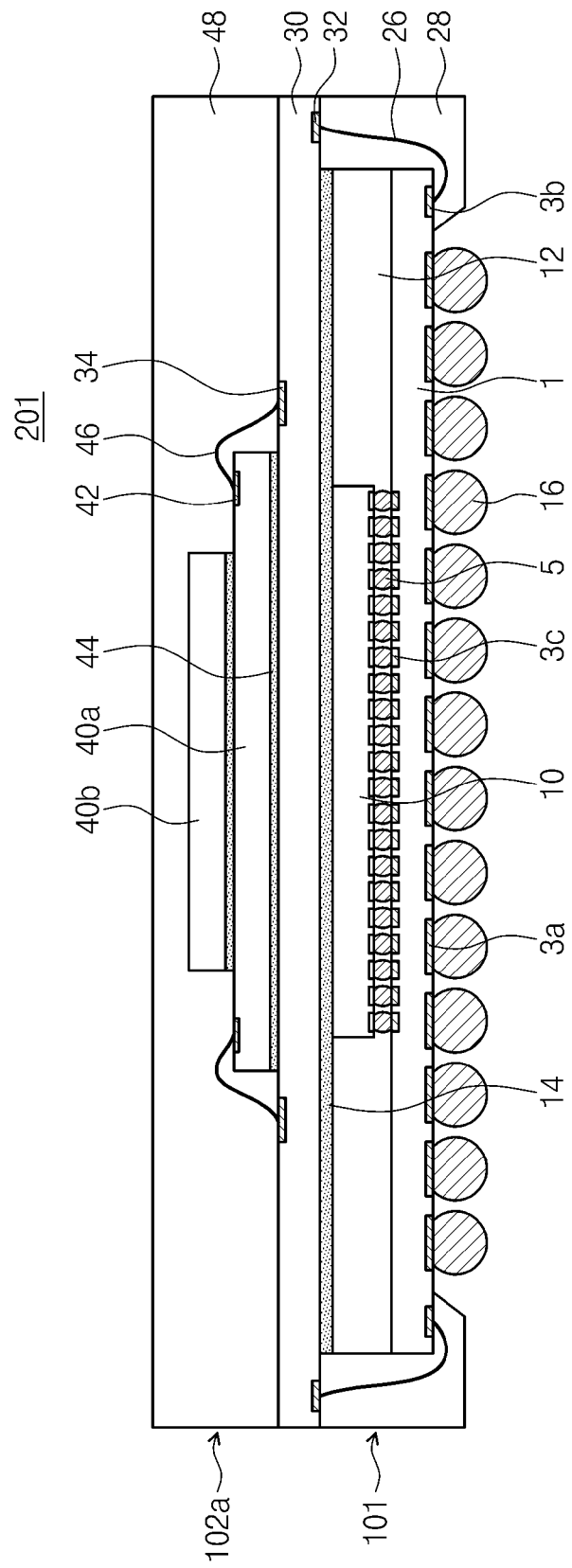
FIG. 11 is a sectional view of a semiconductor package according to other exemplary embodiments.

FIG. 11 is a sectional view of a semiconductor package according to other exemplary embodiments.

Referring to FIG. 11, for a semiconductor package 201 according to the present embodiments, a second package 102a may be provided on a first package 101, but a second substrate 20 serving as an interposer substrate may not be provided therebetween. In other words, the first substrate 10 may be connected to the third substrate 30 without the third solder balls 38 of FIG. 2. The first package 101 may be bonded to a bottom surface of the third substrate 30 by a first adhesive layer 14 interposed therebetween. Second wires 26 may be used to connect twelfth substrate conductive patterns 3b to thirty-first substrate conductive patterns 32. A protection member 28 may be formed to cover the second wires 26, top and side surfaces of an edge of the first substrate 1, and side surfaces of the first mold layer 12 and the first adhesive layer 14, and the bottom surface of the third substrate 30. Except for the differences related to the interposer substrate, the semiconductor package 201 may be configured to have substantially the same or similar features as those of the semiconductor package 200 of FIG. 2.

In the semiconductor package 201, electric connection between the first and second packages 101 and 102a may be realized using the second wires 26. Thus, the exemplary embodiments make it possible to increase the number of I/O pads.

Figure 14:
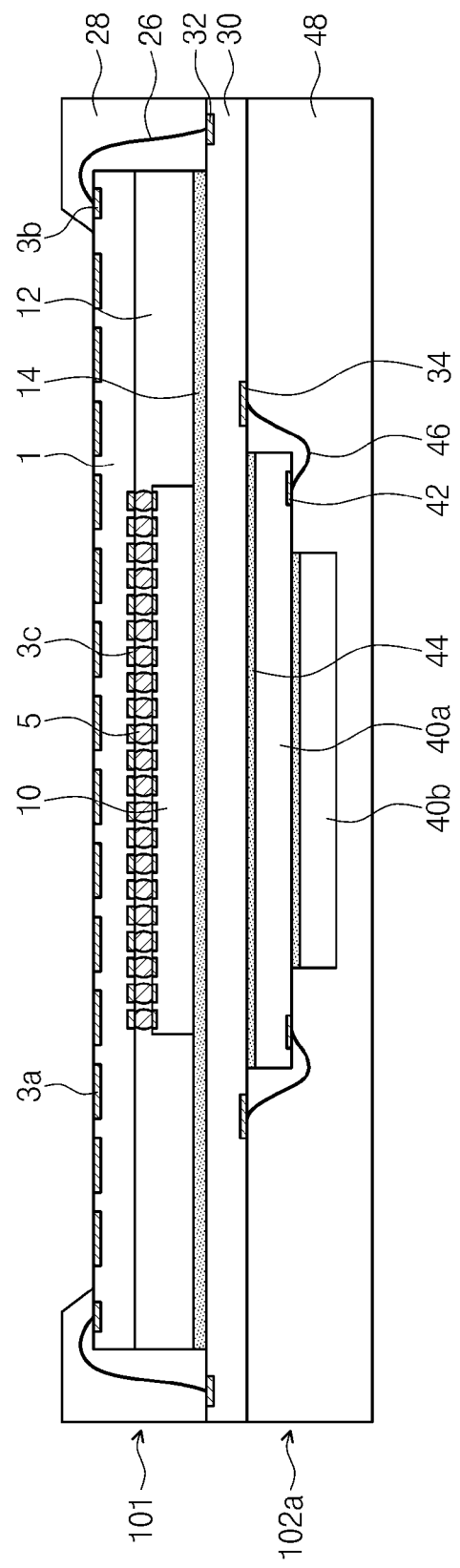

FIGS. 12 through 14 are sectional views illustrating a process of fabricating a semiconductor package, whose sectional view is shaped like that of FIG. 11.

Referring to FIG. 12, the first package 101 of FIG. 5 may be prepared and then inverted. Thereafter, the first package 101 may be attached to a third substrate 30 of a second package 102a.

Referring to FIG. 13, a wire bonding process may be performed to form second wires 26 connecting the twelfth substrate conductive patterns 3b to the thirty-first substrate conductive patterns 32.

Referring to FIG. 14, a protection member 28 may be formed to cover the second wires 26. The protection member 28 may be formed using a molding or printing process. The protection member 28 may be formed of a mold layer or an adhesive resin layer.

Thereafter, as described with reference to FIG. 11, second solder balls 16 may be attached to the eleventh substrate conductive patterns 3a, respectively.

Figure 15:
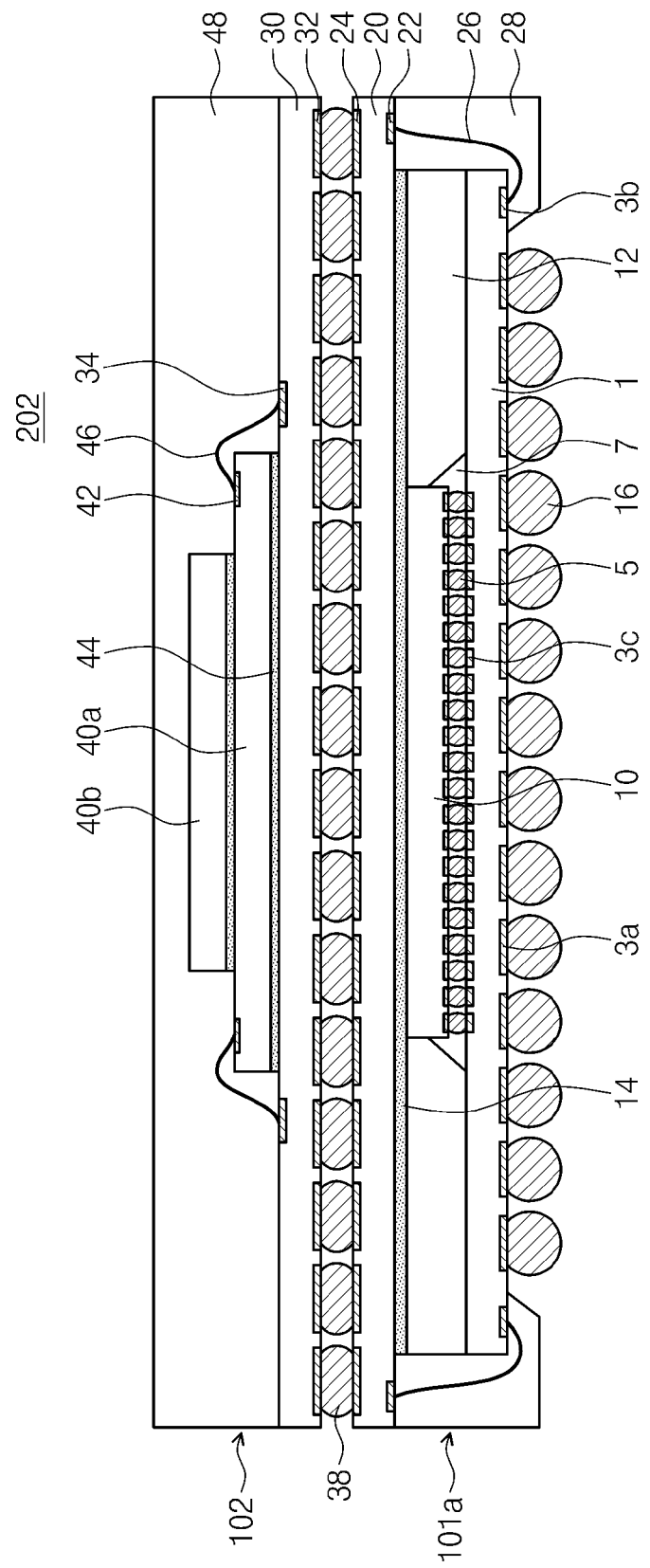
FIGS. 15 through 22 are sectional views of semiconductor packages according to still other exemplary embodiments.

FIG. 15 is a sectional view illustrating an example of semiconductor packages according to still other exemplary embodiments.

Referring to FIG. 15, for a semiconductor package 202 according to the present embodiments, an under fill resin layer 7 may be provided in a first package 101a to fill a gap region between a first semiconductor chip 10 and a first substrate 1. Except for the differences related to the under fill resin layer 7, the semiconductor package 202 may be configured to have substantially the same features as those of the semiconductor package 200 of FIG. 2.

Figure 16:
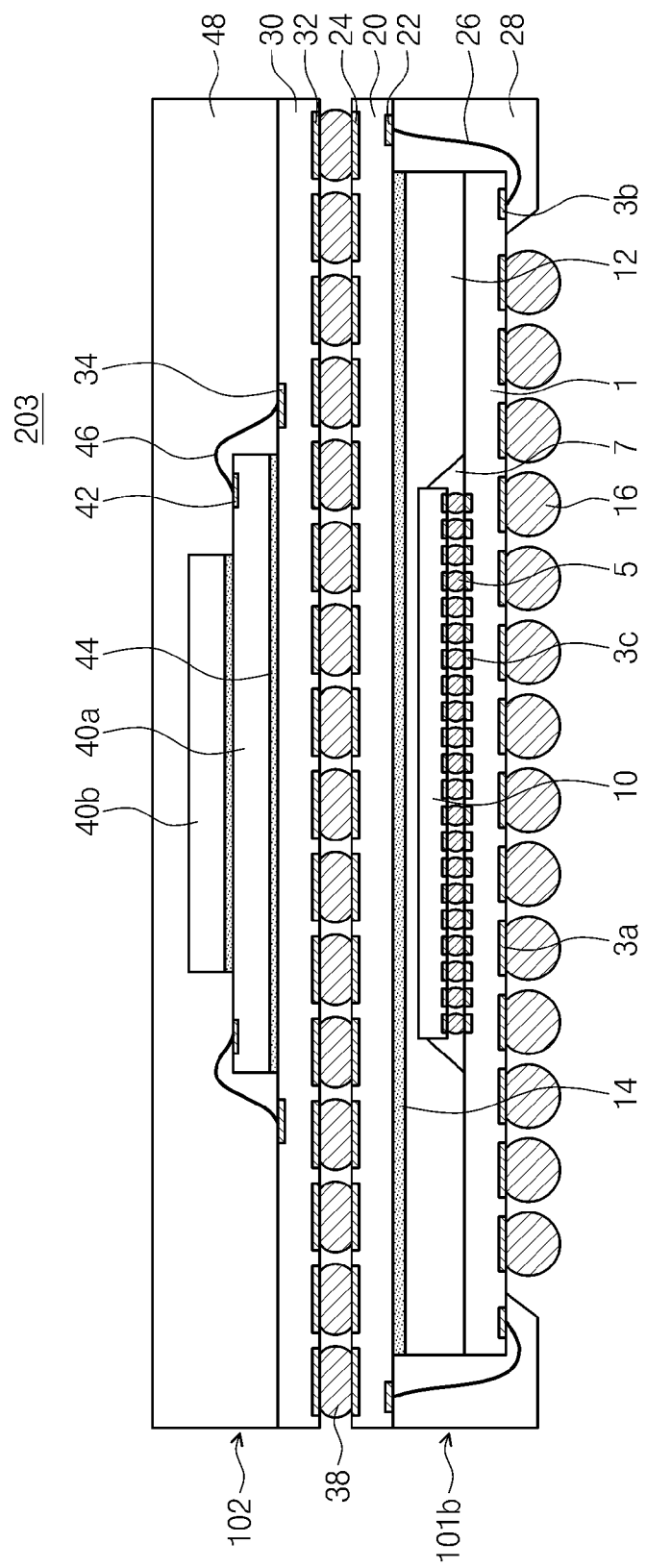

FIG. 16 is a sectional view illustrating other example of semiconductor packages according to still other exemplary embodiments.

Referring to FIG. 16, for a semiconductor package 203 according to the present embodiments, a first semiconductor chip 10 of a first package 101b may be provided with a top surface covered by a first mold layer 12. Except for the differences related to a top surface of the first semiconductor chip 10 covered by the first mold layer 12, the semiconductor package 203 may be configured to have substantially the same features as those of the semiconductor package 200 of FIG. 2.

Figure 17:
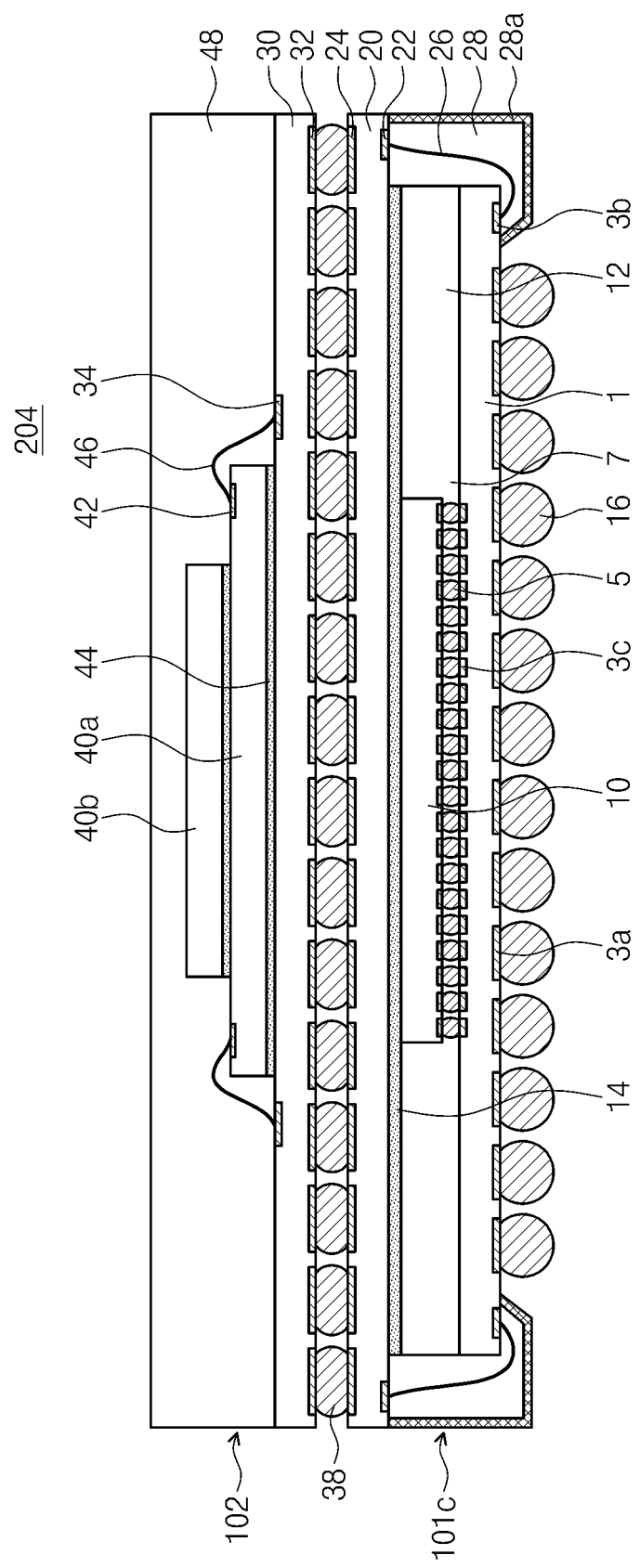

FIG. 17 is a sectional view illustrating still other examples of semiconductor packages according to still other exemplary embodiments.

Referring to FIG. 17, for a semiconductor package 204 according to the present embodiments, a protection member 28a may be provided on a first package 101c. For example, the protection member 28a may be a holder made of a hard insulating material. As an example, the holder may be formed of a polymer material (e.g., polyamide). Although not shown, the protection member 28a (or the holder) may be spaced apart from the wire 26 and a side surface of the first mold layer 12. Although not shown, a space between the protection member 28a and a side surface of the first mold layer 12 may remain devoid of a solid material or be filled with an adhesive resin layer. Except for the differences related to the protection member 28a, the semiconductor package 204 may be configured to have substantially the same features as those of the semiconductor package 200 of FIG. 2.

Figure 18:
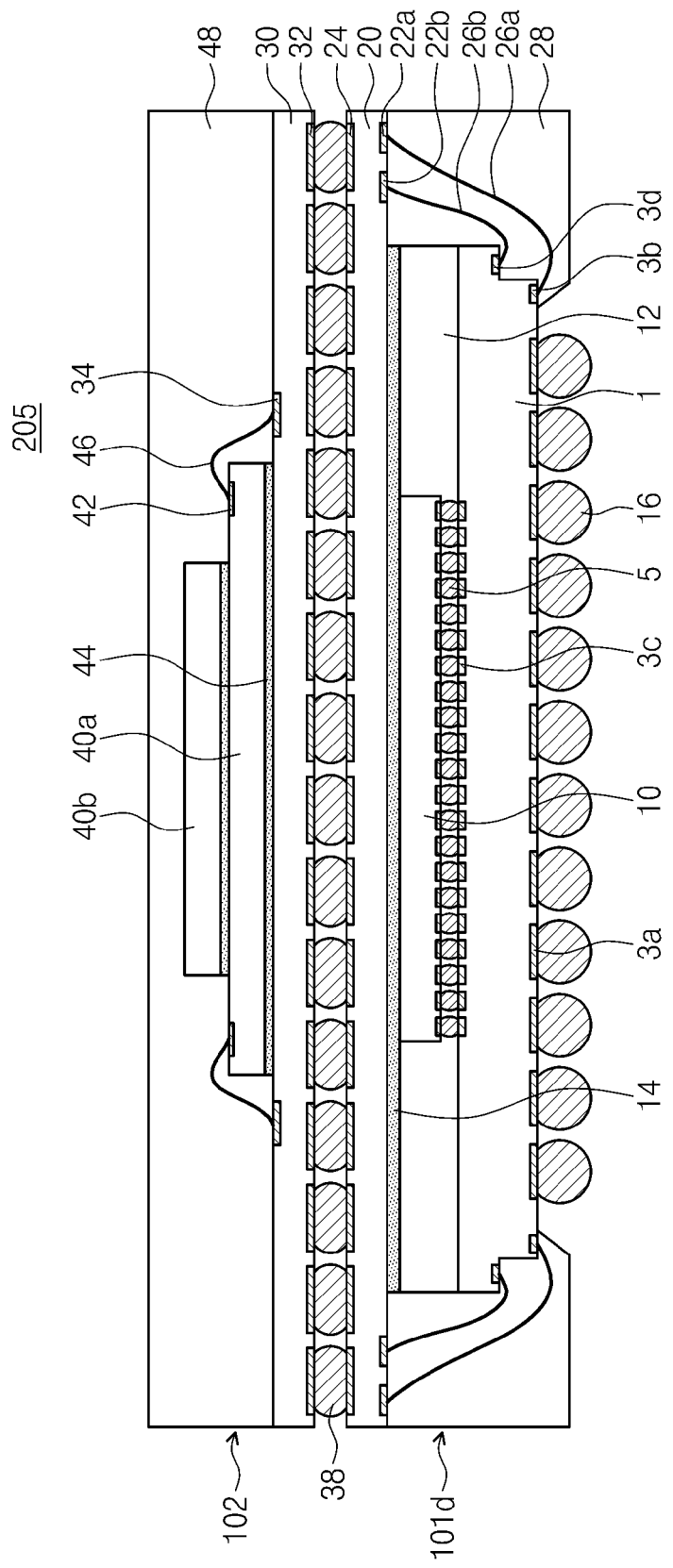

FIG. 18 is a sectional view illustrating other examples of semiconductor packages according to still other exemplary embodiments.

Referring to FIG. 18, in a semiconductor package 205 according to the present embodiments, an edge portion of a first substrate 1 of a first package 101d may be configured to have a staircase structure. For example, by virtue of the staircase structure, it is possible to form a twelfth substrate conductive pattern 3b and a fourteenth substrate conductive pattern 3d at different levels from each other. A twenty-first substrate conductive pattern 22a and a twenty-third substrate conductive pattern 22b may be provided on a bottom surface of a second substrate 20 to be spaced apart from each other. The twelfth substrate conductive pattern 3b and the twenty-first substrate conductive pattern 22a may be electrically connected to each other by a twenty-first wire 26a. The fourteenth substrate conductive pattern 3d and the twenty-third substrate conductive pattern 22c may be electrically connected to each other by a twenty-second wire 26b. A protection member 28 may be formed to cover the twenty-first and twenty-second wires 26a and 26b. Except for the differences related to the twelfth substrate conductive pattern 3b and the fourteenth substrate conductive pattern 3d, the semiconductor package 205 may be configured to have substantially the same features as those of the semiconductor package 200 of FIG. 2.

For the semiconductor package 205, the edge portion of the first substrate 1 may have the staircase structure. Thus, in the exemplary embodiments, it is possible to suppress the twenty-first and twenty-second wires 26a and 26b from hanging down and being connected to each other. Accordingly, compared with the case that the first substrate 1 does not have the staircase structure, it is possible to increase the number of I/O terminals (for example, by twice or more).

Figure 19:
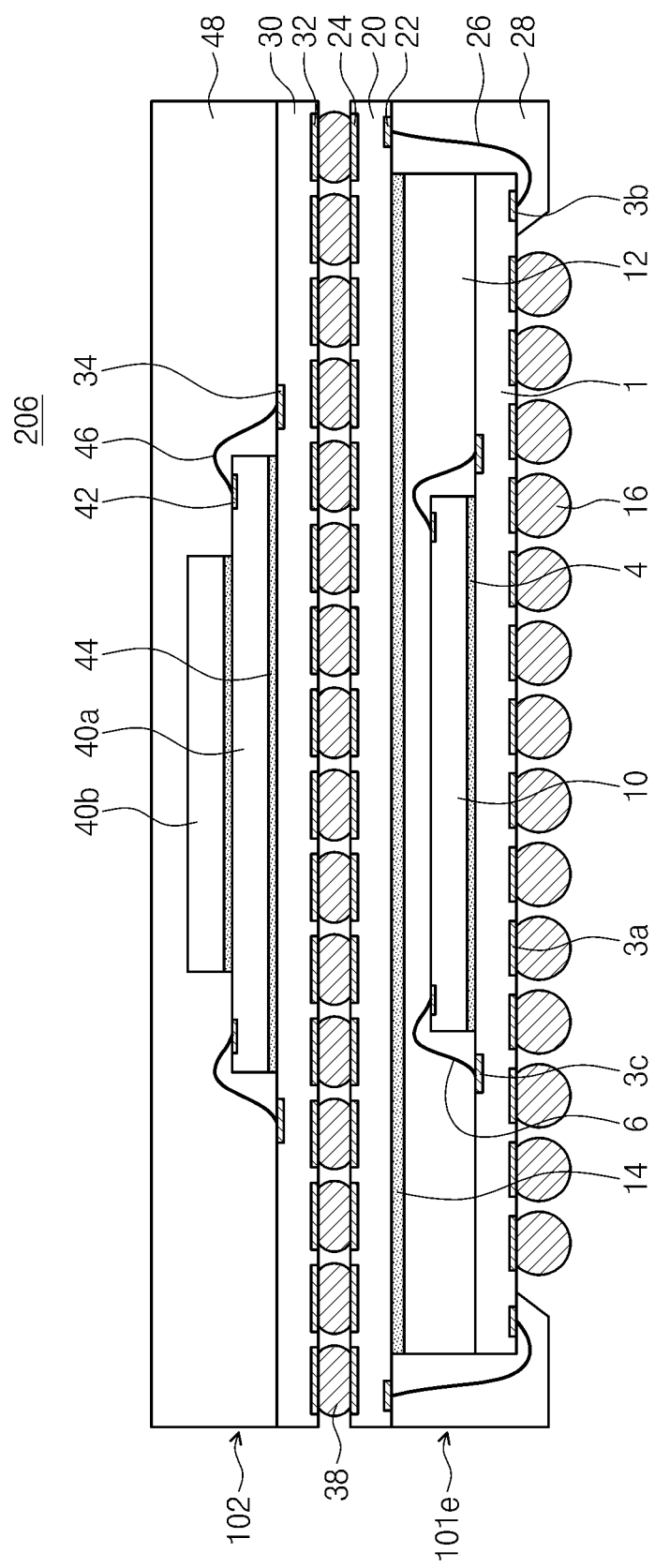

FIG. 19 is a sectional view illustrating other examples of semiconductor packages according to still other exemplary embodiments.

Referring to FIG. 19, for a semiconductor package 206 according to the present embodiments, a first semiconductor chip 10 of a first package 101e may be electrically connected to a first substrate 1 via third wires 6. A first mold layer 12 may be formed to cover the first semiconductor chip 10, the first substrate 1, and the third wires 6. Except for the differences related to the third wires 6, the semiconductor package 206 may be configured to have substantially the same features as those of the semiconductor package 200 of FIG. 2.

Figure 20:
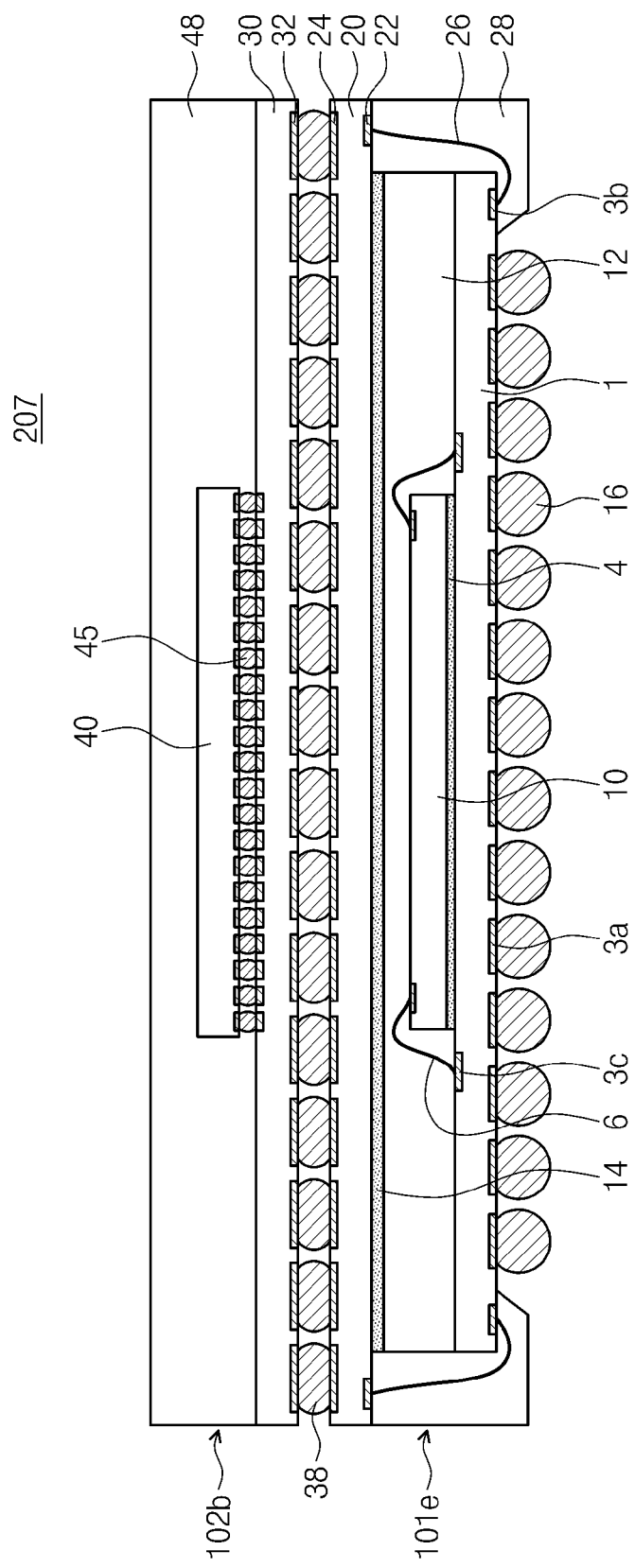

FIG. 20 is a sectional view illustrating further examples of semiconductor packages according to still other exemplary embodiments.

Referring to FIG. 20, for a semiconductor package 207 according to the present embodiments, a second semiconductor chip 40 of a second semiconductor package 102b may be electrically connected to a third substrate 30 via fourth solder balls 45. Except for the differences related to the fourth solder balls 45, the semiconductor package 207 may be configured to have substantially the same features as those of the semiconductor package 206 of FIG. 19.

Figure 21:
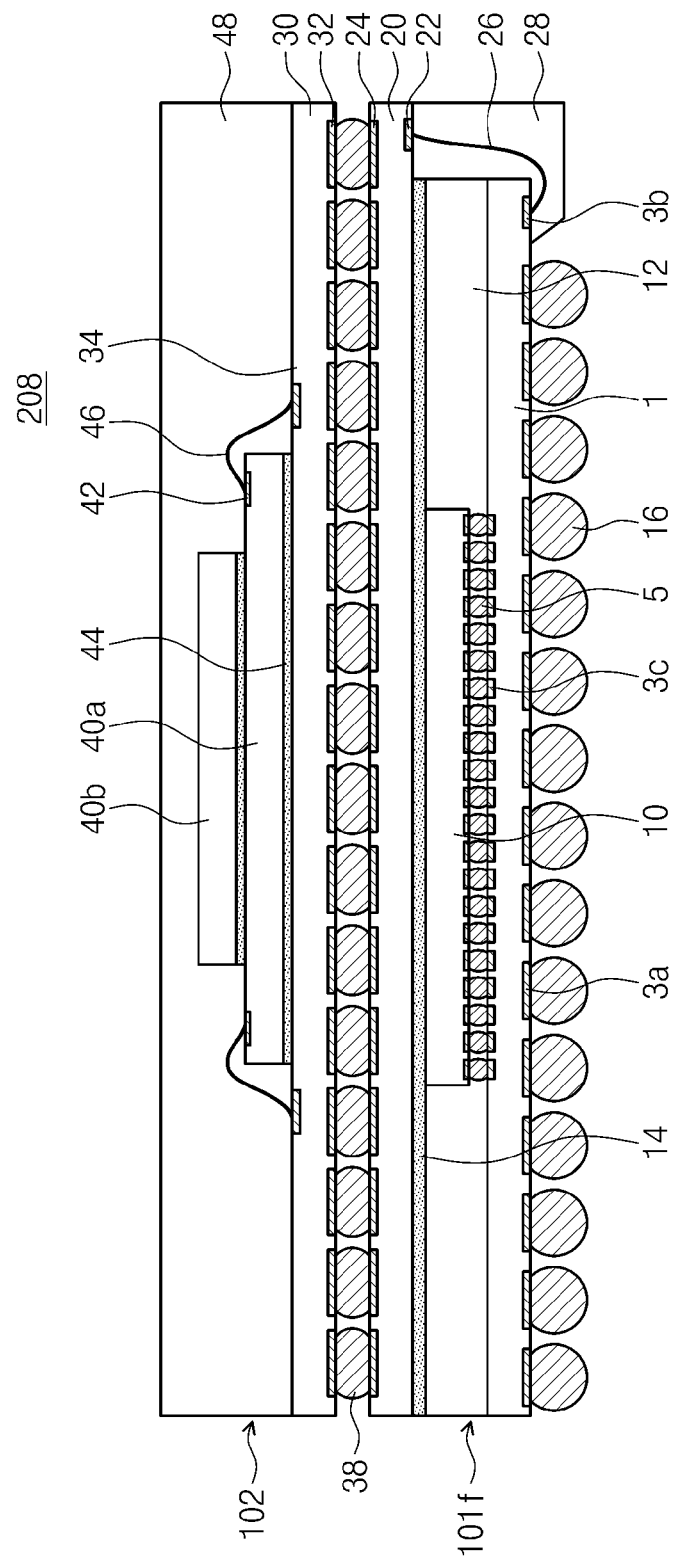

FIG. 21 is a sectional view illustrating still further examples of semiconductor packages according to still other exemplary embodiments.

Referring to FIG. 21, for a semiconductor package 208 according to the present embodiments, second wires 26 may not be provided at all side surfaces of a first package 101f. For example, the second wires 26 may be provided on first, second, and third side surfaces of the first substrate 1. A portion of a second substrate 20 may protrude laterally or outwardly from one of side surfaces of the first substrate 1. A protection member 28 may be provided to cover some of the side surfaces of the first substrate 1 and expose at least one side surface. Except for the differences related to the second wires 26 and the protection member 28, the semiconductor package 208 may be configured to have substantially the same features as those of the semiconductor package 200 of FIG. 2.

Figure 22:
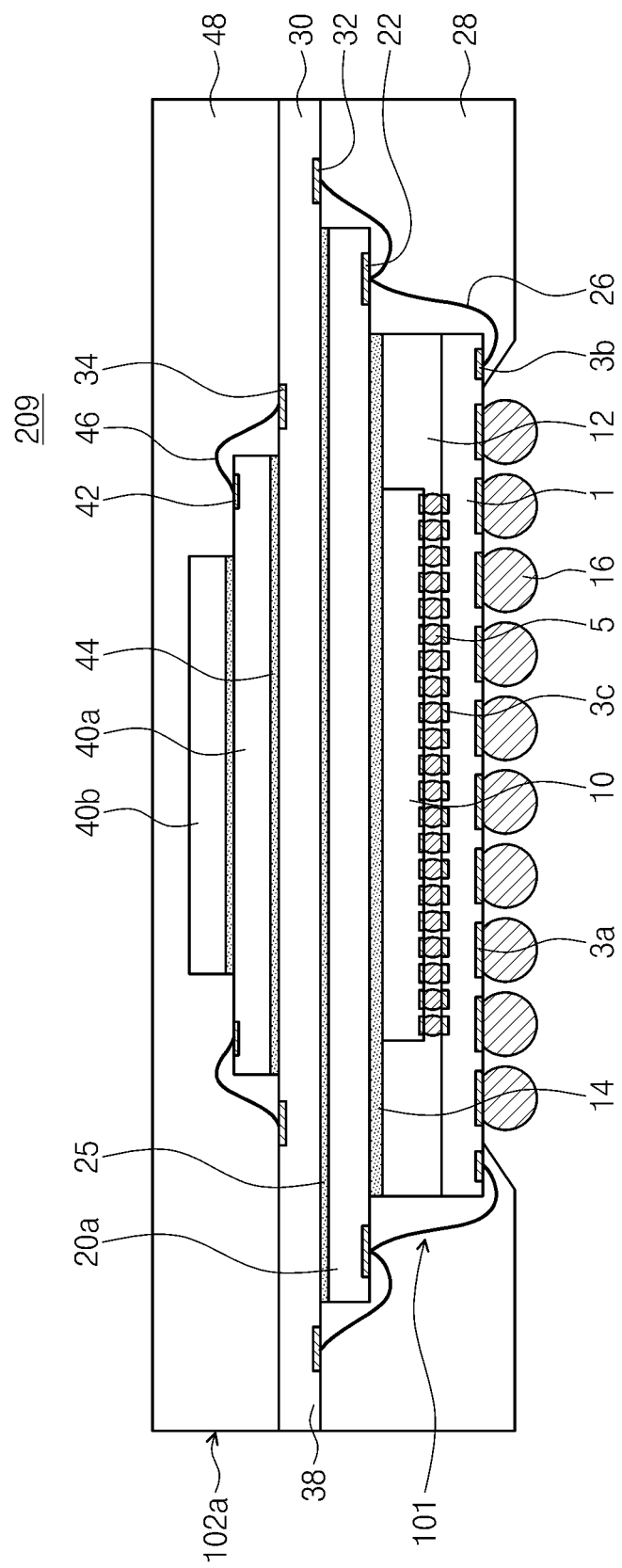

FIG. 22 is a sectional view illustrating even further examples of semiconductor packages according to still other exemplary embodiments.

Referring to FIG. 22, for a semiconductor package 209 according to the present embodiments, a second substrate 20a of a first package 101f may be attached to a third substrate 30 using a third adhesive layer 25. Second wires 26 may be provided to connect sequentially or continuously a twelfth substrate conductive pattern 3b, a twenty-first substrate conductive pattern 22, and a thirty-first substrate conductive pattern 32. A protection member 28 may be provided to cover edge portions of the first substrate 1, the second substrate 20, and the third substrate 30. Except for the differences related to the second wires 26 and the protection member 28, the semiconductor package 208 may be configured to have substantially the same features as those of the semiconductor package 200 of FIG. 2.

The semiconductor packages 200-209 and fabrication methods thereof have been described with reference to FIGS. 1 through 22. A semiconductor device may be one combination of the previously described structures of the semiconductor packages 200-209.

The semiconductor package technology described above may be applied to realize a variety of semiconductor devices and package modules including the same.

Figure 23:
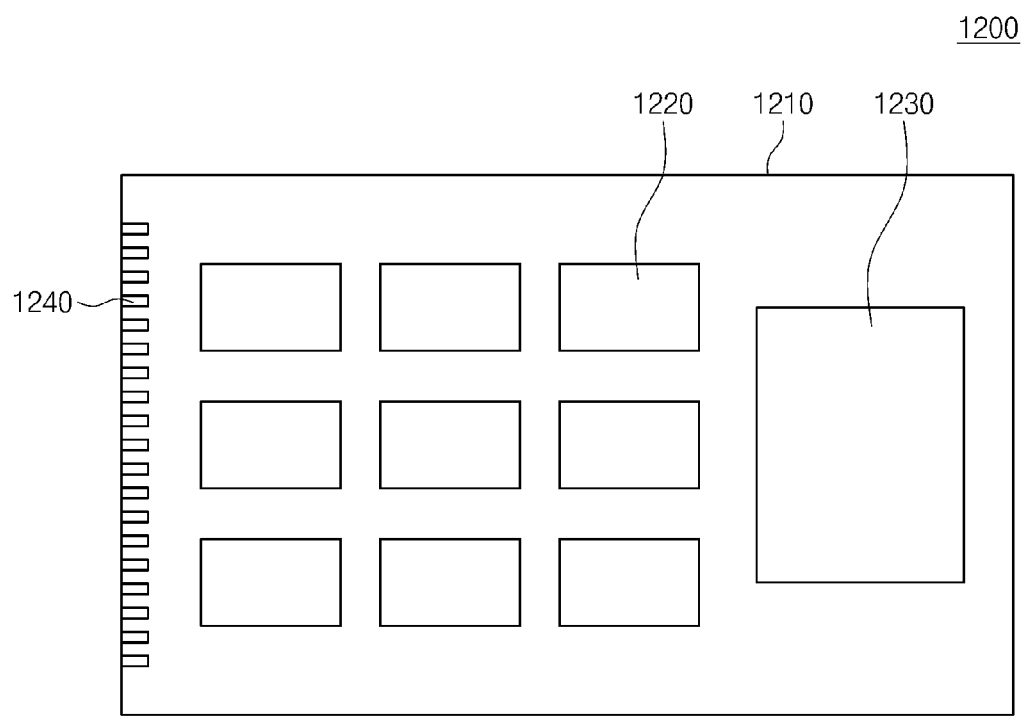
FIG. 23 is a diagram illustrating an example of a package module including a semiconductor package, according to exemplary embodiments.

FIG. 23 is a diagram illustrating an example of package modules including semiconductor packages according to exemplary embodiments. Referring to FIG. 23, a package module 1200 may include a package substrate 1210 which includes semiconductor devices 1220 and a semiconductor device 1230 packaged in a quad flat package (QFP) type. The semiconductor devices 1220 and 1230 may be formed using a semiconductor package technology according to example embodiments. In the package module 1200, the semiconductor devices 1220 and 1230 may be mounted on a semiconductor package 200. The package module 1200 may be connected to an external electronic device through an external connection terminal 1240 disposed at one side of the package substrate 1210.

Figure 24:
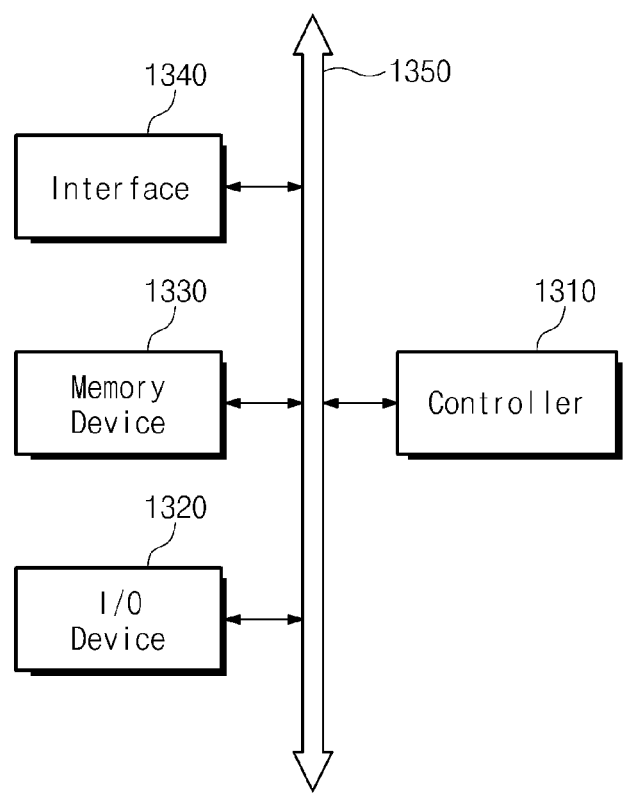
FIG. 24 is a schematic block diagram illustrating an example of electronic systems including semiconductor packages according to exemplary embodiments.

The semiconductor package technology may be applied to realize electronic systems. FIG. 24 is a schematic block diagram illustrating an example of electronic systems including semiconductor packages according to example embodiments. Referring to FIG. 24, an electronic system 1300 may include a controller 1310, an input/output (I/O) unit 1320, and a memory device 1330. The controller 1310, the input/output unit 1320, and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor, and the microcontroller. The controller 1310 and the memory device 1330 may include the semiconductor package according to exemplary embodiments. The input/output unit 1320 may include a keypad, a keyboard, and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset, and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as code division multiple access (CDMA), global system for mobile communications (GSM), network assisted D2D communication (NADC), extended time division multiple access (E-TDMA), wideband code division multiple access (WCDMA), code division multiple access 2k (CDMA2000), wireless fidelity (Wi-Fi), municipal wireless fidelity (Muni Wi-Fi), Bluetooth, digital enhanced cordless telecommunications (DECT), wireless universal serial bus (Wireless USB), flash orthogonal frequency division multiplexing (Flash-OFDM), institute of electrical and electrons engineers 802.20 (IEEE 802.20), general packet radio service (GPRS), high capacity spatial division multiple access (iBurst), wireless broadband (WiBro), worldwide interoperability for microwave access (WiMAX), WiMAX-Advanced, universal mobile telecommunications system time-division duplexing (UMTS-TDD), high speed packet access (HSPA), enhanced voice-data optimized (EVDO), long-term evolution advanced (LTE-Advanced), multichannel multipoint distribution service (MMDS), and so forth.

Figure 25:
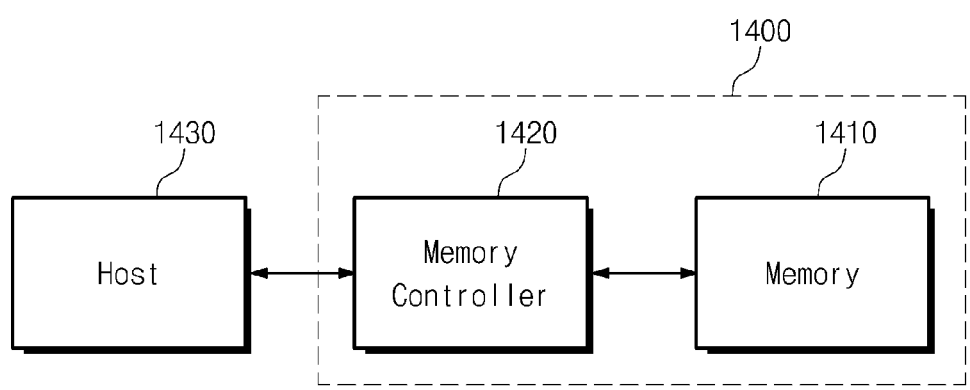
FIG. 25 is a schematic block diagram illustrating an example of memory systems including semiconductor packages according to exemplary embodiments.

The semiconductor device according to exemplary embodiments may be provided in a form of a memory card. FIG. 25 is a schematic block diagram illustrating an example of memory systems including semiconductor packages according to exemplary embodiments. Referring to FIG. 25, a memory system 1400 may include a non-volatile memory device 1410 and a memory controller 1420. The non-volatile memory device 1410 and the memory controller 1420 may store data or read stored data. The non-volatile memory device 1410 may include at least one non-volatile memory device, to which the semiconductor package technology is applied according to exemplary embodiments. The memory controller 1420 may control the non-volatile memory device 1410 in order to read the stored data and/or to store data in response to a read/write request of a host 1430.

According to exemplary embodiments, the semiconductor package may include lower and upper packages electrically connected to each other by wires. Each of the wires may thinner than a solder ball. Thus, in the exemplary embodiments, it is possible to increase the number of channels and/or I/O pads connecting the lower and upper packages.

In a semiconductor package according to exemplary embodiments, a first package may be attached to a second package, and a first substrate of the first package may be electrically connected to a second substrate of the second package using wires. In this case, all electrical paths between the packages may be realized through the wires. Thus, the exemplary embodiments makes it possible to further increase the number of I/O pads.

In a semiconductor package according to exemplary embodiments, an edge portion of a first substrate may have a staircase or stepwise structure. The staircase or stepwise structure prevents the wires from hanging down and being in contact with each other. Accordingly, compared with the case that the first substrate does not have the staircase structure, the exemplary embodiments may increase the number of I/O terminals (for example, twice or more).

Further, the packages may be connected to each other without a solder ball. Thus, in the exemplary embodiments, a laser process for forming holes in a mold layer may be omitted. In other words, the fabrication process may be simplified.

While exemplary embodiments have been particularly shown and described, it will be understood by one of ordinary skill in the art that variations in form and detail may be made therein without departing from the spirit and scope of the attached claims.

What is claims is:

1. A semiconductor package, comprising:
   a first substrate;
   a first semiconductor chip which is mounted on the first substrate;
   a second substrate which is disposed on the first semiconductor chip;
   at least one second semiconductor chip which is disposed on the second substrate; and
   a plurality of wires which are in contact with the first substrate and the second substrate to connect first substrate conductive patterns in the first substrate and second substrate conductive patterns in the second substrate to each other.

2. The semiconductor package of claim 1, wherein the second substrate has a larger width than the first substrate.

3. The semiconductor package of claim 1, wherein the second substrate comprises at least a portion located outside of the first substrate, when viewed in a plan view.

4. The semiconductor package of claim 1, further comprising:
   a mold layer which covers at least a side surface of the first semiconductor chip and the first substrate.

5. The semiconductor package of claim 1, further comprising:
   an adhesive layer which is interposed between the first semiconductor chip and the second substrate to attach the first semiconductor chip to the second substrate.

6. The semiconductor package of claim 1, further comprising:
   a third substrate which is disposed on the second substrate and electrically connected to the second substrate,
   wherein the at least one second semiconductor chip is mounted on the third substrate.

7. The semiconductor package of claim 6, further comprising:
   a plurality of solder balls which are interposed between the second substrate and the third substrate to electrically connect the second substrate and the third substrate to each other.

8. The semiconductor package of claim 1, further comprising:
   a protection member which covers the wires.

9. The semiconductor package of claim 8, wherein the protection member comprises at least one of a mold layer, an adhesive resin layer, or a holder.

10. The semiconductor package of claim 1, wherein the first semiconductor chip comprises a logic chip, and
    wherein the at least one second semiconductor chip comprises a memory chip.

11. The semiconductor package of claim 1, wherein an edge portion of the first substrate has a staircase structure.

12. The semiconductor package of claim 11, wherein the first substrate comprises a first substrate conductive pattern and a second substrate conductive pattern which are positioned at different levels in a vertical direction from each other,
    wherein the second substrate comprises a third substrate conductive pattern and a fourth substrate conductive pattern which are spaced apart in a horizontal direction from each other,
    wherein the wires comprises a first wire which connects the first substrate conductive pattern to the third substrate conductive pattern and a second wire which connects the second substrate conductive pattern to the fourth substrate conductive pattern.

13. The semiconductor package of claim 1, further comprising:
    a third substrate which is disposed on the second substrate and electrically connected to the second substrate,
    wherein the at least one second semiconductor chip is mounted on the third substrate, and
    wherein the wires are connected to the first substrate, the second substrate, and the third substrate.

14. The semiconductor package of claim 1, further comprising:
    a plurality of solder balls which are attached to a bottom surface of the first substrate.

15. A semiconductor package, comprising:
   a first package;
   a second package which is stacked on the first package; and
   a plurality of wires which electrically connect the first package to the second package, without solder balls.

16. The semiconductor package of claim 15, wherein the second package comprises at least an end portion located outside of the first package, when viewed in a plan view.

17. The semiconductor package of claim 15, wherein the second package has a larger width than the first package.

18. The semiconductor package of claim 15, further comprising:
   an interposer substrate which is interposed between the first package and the second package,
   wherein the wires electrically connect the interposer substrate to the first package.

19. The semiconductor package of claim 15, wherein the first package and the second package comprise a first substrate and a second substrate, respectively,
   wherein the first package and the second package are attached to each other by an adhesive layer, and
   wherein the wires electrically connect the first substrate to the second substrate.

20. A semiconductor package, comprising:
   a first package which comprises an edge portion having a staircase structure;
   a second package which is stacked on the first package; and
   a plurality of wires which electrically connect an end portion of the staircase structure of the first package to the second package.

* * * * *